United States Patent
Yang

(10) Patent No.: US 9,470,714 B2
(45) Date of Patent: Oct. 18, 2016

(54) TESTING APPARATUS FOR FLASH MEMORY CHIP

(71) Applicant: Silicon Motion, Inc., Jhubei, Hsinchu County (TW)

(72) Inventor: Hua-An Yang, Guangdong (CN)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 14/620,532

(22) Filed: Feb. 12, 2015

(65) Prior Publication Data

US 2016/0103152 A1    Apr. 14, 2016

(30) Foreign Application Priority Data

Oct. 8, 2014    (CN) .......................... 2014 1 0528010

(51) Int. Cl.
| | |
|---|---|
| *G01R 31/20* | (2006.01) |
| *G11C 29/50* | (2006.01) |
| *G01R 1/04* | (2006.01) |
| *G11C 29/56* | (2006.01) |
| *G11C 11/00* | (2006.01) |
| *G11C 29/04* | (2006.01) |

(52) U.S. Cl.
CPC ....... *G01R 1/0441* (2013.01); *G11C 29/56016* (2013.01); *G11C 11/005* (2013.01); *G11C 2029/0401* (2013.01); *G11C 2029/5602* (2013.01)

(58) Field of Classification Search
CPC .. G01R 1/0433; G01R 1/0441; G01R 1/045; G01R 1/0458; G01R 1/0466; G01R 1/0475; G01R 1/0483; G01R 1/0491; G11C 29/50
USPC ...................................................... 324/750.25
See application file for complete search history.

(56) References Cited

U.S. PATENT DOCUMENTS

| | | | | |
|---|---|---|---|---|
| 6,233,681 | B1* | 5/2001 | Kang ........................ | G06F 8/65 713/2 |
| 6,369,595 | B1* | 4/2002 | Farnworth ........... | G01R 1/0483 324/756.02 |
| 8,597,788 | B2 | 12/2013 | Banerjee et al. | |
| 8,667,345 | B2 | 3/2014 | Chang et al. | |
| 2009/0015279 | A1* | 1/2009 | Cho ..................... | G01R 1/0483 324/756.02 |

(Continued)

FOREIGN PATENT DOCUMENTS

| | | |
|---|---|---|
| CN | 103514958 | 1/2014 |
| TW | 200512759 | 4/2005 |

(Continued)

*Primary Examiner* — Billy Lactaoen
(74) *Attorney, Agent, or Firm* — McClure, Qualey & Rodack, LLP

(57) ABSTRACT

A test apparatus for testing a first flash memory chip is provided. The testing apparatus includes: an interface printed circuit board (PCB), a separate PCB, and a socket device. The separate PCB is disposed over the interface PCB, and a second flash memory chip is placed between the interface PCB and the separate PCB. The second flash memory chip includes a first embedded flash memory chip and a dynamic random access memory (DRAM), and the second flash memory chip is connected to the interface PCB through corresponding first pins of the DRAM. The socket device is disposed over the separate PCB and is configured to install the first flash memory chip. The first flash memory chip is connected to the interface PCB through corresponding second pins.

7 Claims, 5 Drawing Sheets

(56) References Cited

U.S. PATENT DOCUMENTS

2011/0260309 A1* 10/2011 Lee ............... G01R 1/0466
                                            257/676
2013/0250709 A1    9/2013  Chen

FOREIGN PATENT DOCUMENTS

| TW | 200809878 | 2/2008 |
| TW | 201339598 | 10/2013 |

* cited by examiner

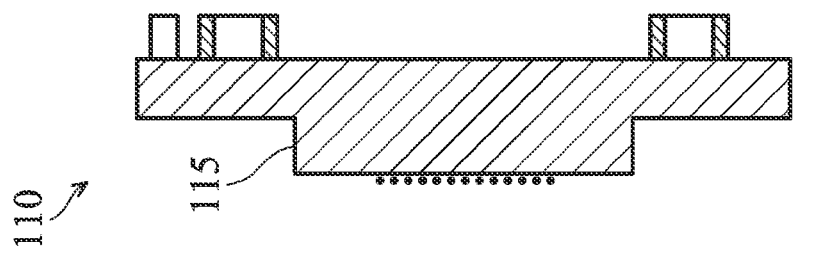
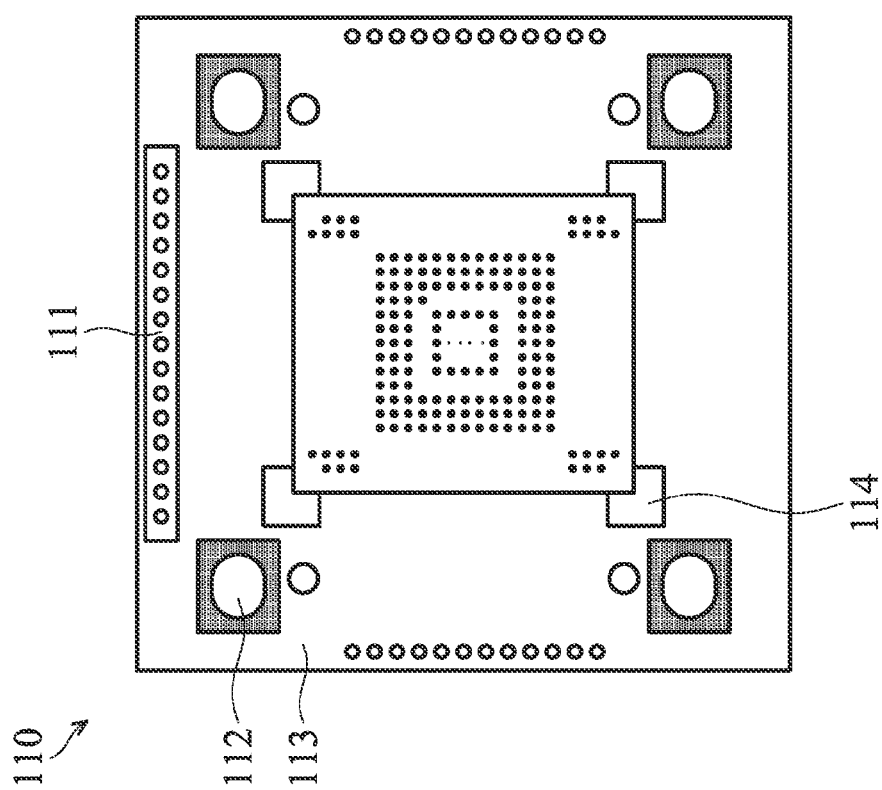
FIG. 2A
FIG. 2B

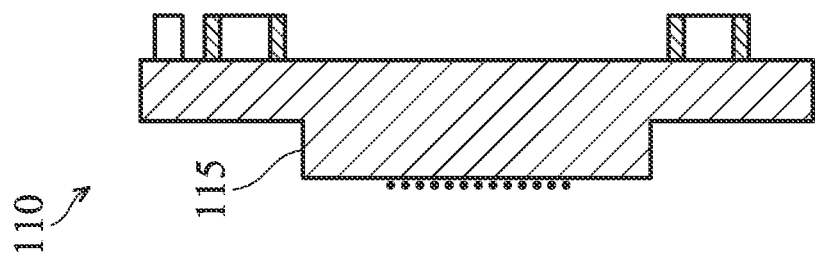
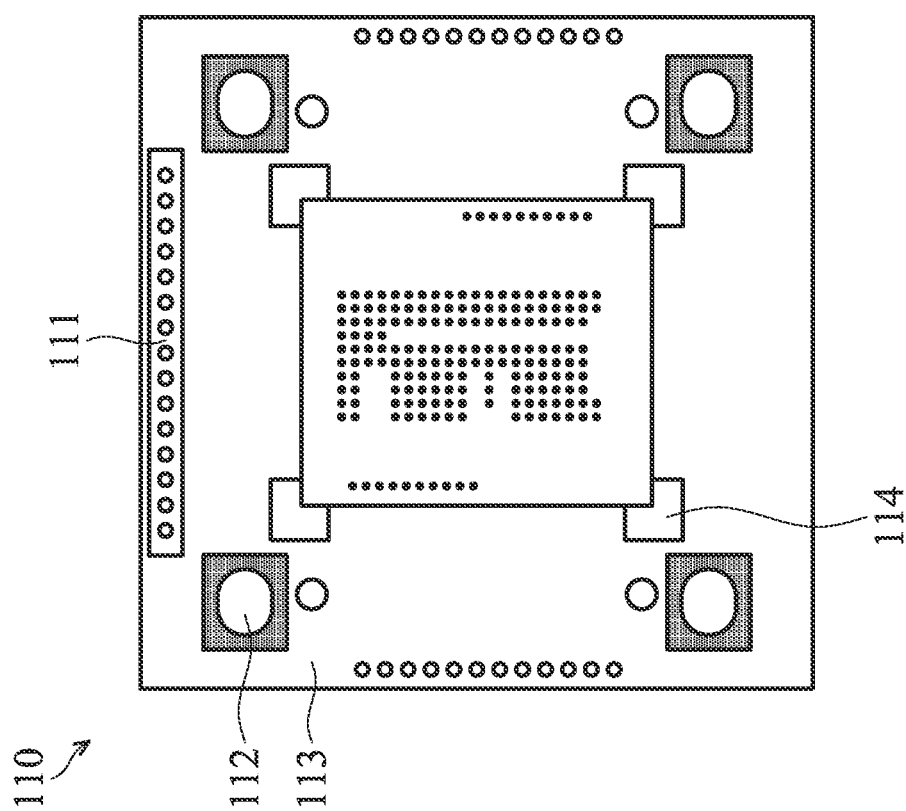
FIG. 2D
FIG. 2C under the PCB to test the eMMC signals. The PCB is usually damaged by the aforementioned operations, resulting in failure of testing eMMC signals. (2) there are NAND flash pins on the eMMC/eMCP/CiMCP chip, but there are no dedicated pins for testing the NAND flash memory on a traditional PCB, so that the NAND flash memory signals cannot be tested on the traditional PCB. (3) the eMMC chip and the DDR memory are packaged together into a eMCP/CiMCP chip, and the signals from the eMMC chip and the DDR memory cannot be separated in the traditional way.

US 9,470,714 B2

TESTING APPARATUS FOR FLASH MEMORY CHIP

CROSS REFERENCE TO RELATED APPLICATIONS

This application claims priority of China Patent Application No. 201410528010.2, filed on Oct. 8, 2014, the entirety of which is incorporated by reference herein.

BACKGROUND OF THE INVENTION

1. Field of the Invention

The present invention relates to a testing apparatus, and, in particular, to a testing apparatus capable of replacing flash memory chips quickly and separating signals of the flash memory and the dynamic random access memory (DRAM).

2. Description of the Related Art

Embedded memories, such as embedded multimedia card (eMMC), embedded multi-chip package (eMCP), and card-interface multi-chip package (CiMCP), on a printed circuit board (PCB) are usually packaged with a fine-pitch ball grid array (FBGA) which is usually very close to the core chip, and dedicated FBGA soldering equipment is required for installing and replacing the embedded memories. In addition, repeated soldering operations may easily damage the PCB, the core chip, and the flash memory of the eMMC chip (e.g. NAND flash memory). Generally, an external device is required to install and replace the eMMC/eMCP/CiMCP chip, so that the NAND flash memory of the eMMC chip will not be damaged.

The eMMC chip and a DDR memory are packaged together in an eMCP/CiMCP chip on the PCB. Accordingly, an external device should be used to separate the eMMC signals and DDR memory signals, so that the eMMC chip can be installed and replaced easily. On the PCB, the eMMC device and the eMMC host are connected to each other through the wires on the PCB. Accordingly, an external device should be used to induct the test points of the eMMC signals to test the eMMC signals.

Traditionally, the eMMC/eMCP/CiMCP chip is firstly unloaded from the PCB, and a FBGA socket is installed on the soldering point of the eMMC/eMCP/CiMCP. Thus, the eMMC/eMCP/CiMCP chip can be placed into the FBGA socket. However, there are many electronic components around the soldering place of the eMMC/eMCP/CiMCP chip, and there is no spare space and structure to hold the FBGA socket. Accordingly, a dedicated FBGA socket device should be designed based on the shape of the PCB, and then the eMMC/eMCP/CiMCP chip can be placed into the FBGA socket device, and the dedicated FBGA socket device is fixed onto the PCB. Accordingly, the traditional way may take a very long time to perform the aforementioned operations, and the size of the FBGA socket device is very large, and there are no testing points for eMMC signals.

In addition, there are several disadvantages to the traditional method. For example, (1): the insulation layer of the PCB should be exposed, and some additional wires are soldered onto the PCB to test the eMMC signals. The PCB is usually damaged by the aforementioned operations, resulting in failure of testing eMMC signals. (2) there are NAND flash pins on the eMMC/eMCP/CiMCP chip, but there are no dedicated pins for testing the NAND flash memory on a traditional PCB, so that the NAND flash memory signals cannot be tested on the traditional PCB. (3) the eMMC chip and the DDR memory are packaged together into a eMCP/CiMCP chip, and the signals from the eMMC chip and the DDR memory cannot be separated in the traditional way.

BRIEF SUMMARY OF THE INVENTION

A detailed description is given in the following embodiments with reference to the accompanying drawings.

In an exemplary embodiment, a testing apparatus for testing a first flash memory chip is provided. The testing apparatus includes: an interface printed circuit board (PCB); a separate PCB, disposed over the interface PCB, wherein a second flash memory chip is placed between the interface PCB and the separate PCB, and the second flash memory chip includes a first embedded flash memory chip and a dynamic random access memory (DRAM), wherein the second flash memory chip is connected to the interface PCB through corresponding first pins of the DRAM; and a socket device, disposed over the separate PCB and configured to install the first flash memory chip, wherein the first flash memory chip is connected to the interface PCB through corresponding second pins.

BRIEF DESCRIPTION OF THE DRAWINGS

The present invention can be more fully understood by reading the subsequent detailed description and examples with references made to the accompanying drawings, wherein:

FIG. 2A is a schematic diagram of the interface PCB from the top view in accordance with an embodiment of the invention;

FIG. 2B is a schematic diagram of the interface PCB from the side view in accordance with an embodiment of the invention;

FIG. 2C is a schematic diagram of the interface PCB from the top view in accordance with another embodiment of the invention;

FIG. 2D is a schematic diagram of the interface PCB from the side view in accordance with another embodiment of the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
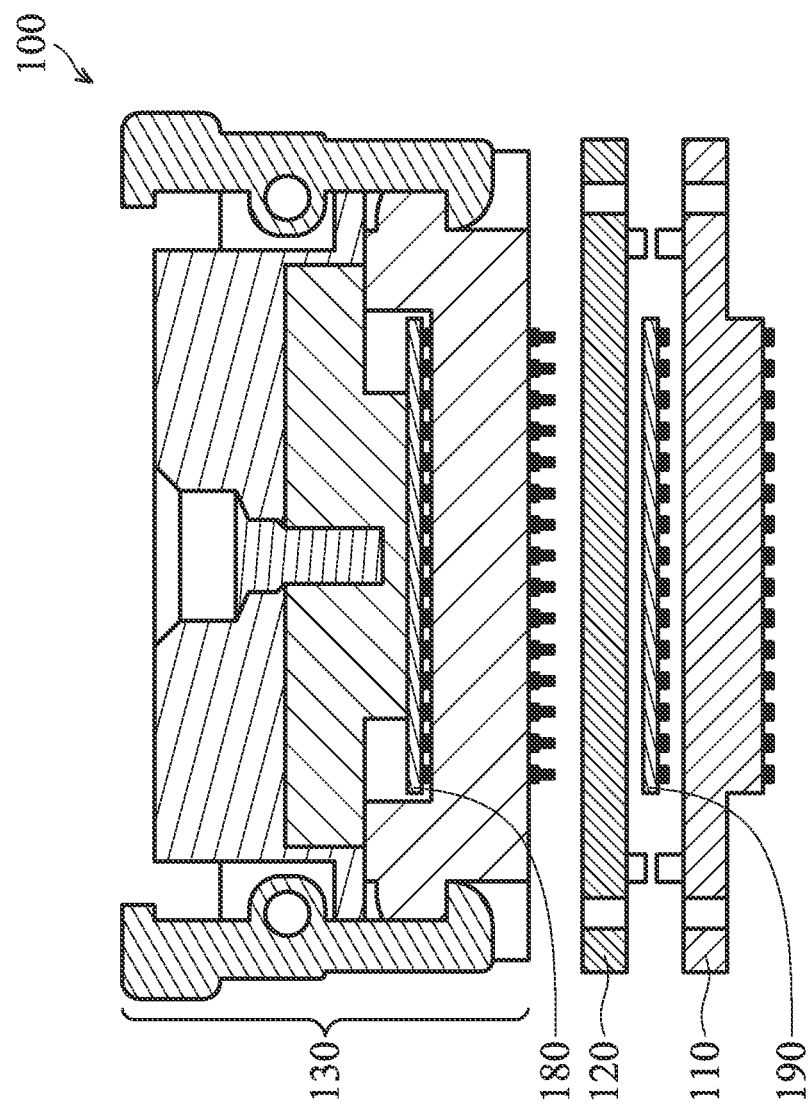
FIG. 1 is a schematic diagram of a testing apparatus in accordance with an embodiment of the invention.

FIG. 1 is a schematic diagram of a testing apparatus in accordance with an embodiment of the invention. As shown in FIG. 1, the testing apparatus comprises an interface PCB 110, a separate PCB 120, and a socket device 130. In an embodiment, the interface PCB 110 provides NAND flash pins and eMMC pins for signal testing. For example, the interface PCB 110 can be made of a high-temperature-resistant fiberglass board which supports the FBGA153 and FBGA162 specifications, but the invention is not limited thereto. That is, the interface PCB 110 may support the FBGA specifications having 153 pins and 162 pins. Similarly, the separate PCB 120 and the socket device 130 also support the FBGA153 and FBGA162 specifications. In an embodiment, the eMMC chip 180 under test can be placed in the socket device 130, as shown in FIG. 1. In another embodiment, the eMMC chip 180 under test can be placed in the socket device 130, and another eMMC/eMCP/CiMCP chip 190 under test can be placed between the interface PCB 110 and the separate PCB 120, and the details will be described later.

FIG. 2A is a schematic diagram of the interface PCB from the top view in accordance with an embodiment of the invention. FIG. 2B is a schematic diagram of the interface PCB from the side view in accordance with an embodiment of the invention. As shown in FIG. 2A and FIG. 2B, in an embodiment, the interface PCB 110 supports the FBGA 153 specification, and the interface PCB 110 comprises eMMC pin jumper 111, a socket holder 112, NANA flash memory pins 113, and an alignment window 114. For example, the eMMC/eMCP/CiMCP chip can be soldered with the corresponding pins of the interface PCB 110, such as the soldering pins (e.g. solder balls) supporting the FBGA153 specification. Specifically, a PCB layout tool can be used in designing and manufacturing the testing circuit. Then, the lug boss 115 and the alignment window 114 of each testing PCB are further processed. The socket holder 112 is fixed onto the testing PCB with high-temperature-resistant glue, and the testing pins can be further soldered onto the solder balls on the testing PCB. Afterwards, the socket holder 112 can be fixed onto the interface PCB 110 by four studs. Accordingly, the user only has to place the eMMC/eMCP/CiMCP chip in the socket device 130 to accomplish the installation and replacement procedure of the chip under test.

FIG. 2C is a schematic diagram of the interface PCB from the top view in accordance with another embodiment of the invention. FIG. 2D is a schematic diagram of the interface PCB from the side view in accordance with another embodiment of the invention. As shown in FIG. 2C and FIG. 2D, in another embodiment, the interface PCB 110 supports the FBGA 153 specification, and the interface PCB 110 comprises eMMC pin jumper 111, a socket holder 112, NAND flash memory pins 113, and an alignment window 114. The difference between FIGS. 2C~2D and FIGS. 2A~2B is the number of FBGA pins, and the details of FIGS. 2C~2D can be referred to in the embodiments of FIGS. 2A~2B, and thus the details will be omitted here.

It should be noted that a lug boss 115 is used in the interface PCB 110 so that no interference with the components around the soldering place of the eMMC/eMCP/CiMCP chip will occur. In addition, the alignment window 114 is used in the interface PCB so that the user may precisely align the interface PCB 110 with the solder pins of the testing PCB. Furthermore, high-temperature-resistant glue is further used to hold the socket holding device 112, so that the size of the socket holder 112 can be shrunk, and the socket holder 112 will not drop during the soldering of the interface PCB 110 with the testing PCB.

Figure 3B:
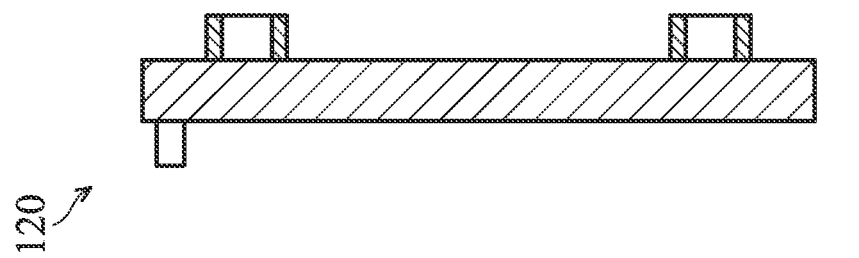
FIG. 3B is a schematic diagram of the separate PCB from the side view in accordance with an embodiment of the invention.
Figure 3A:
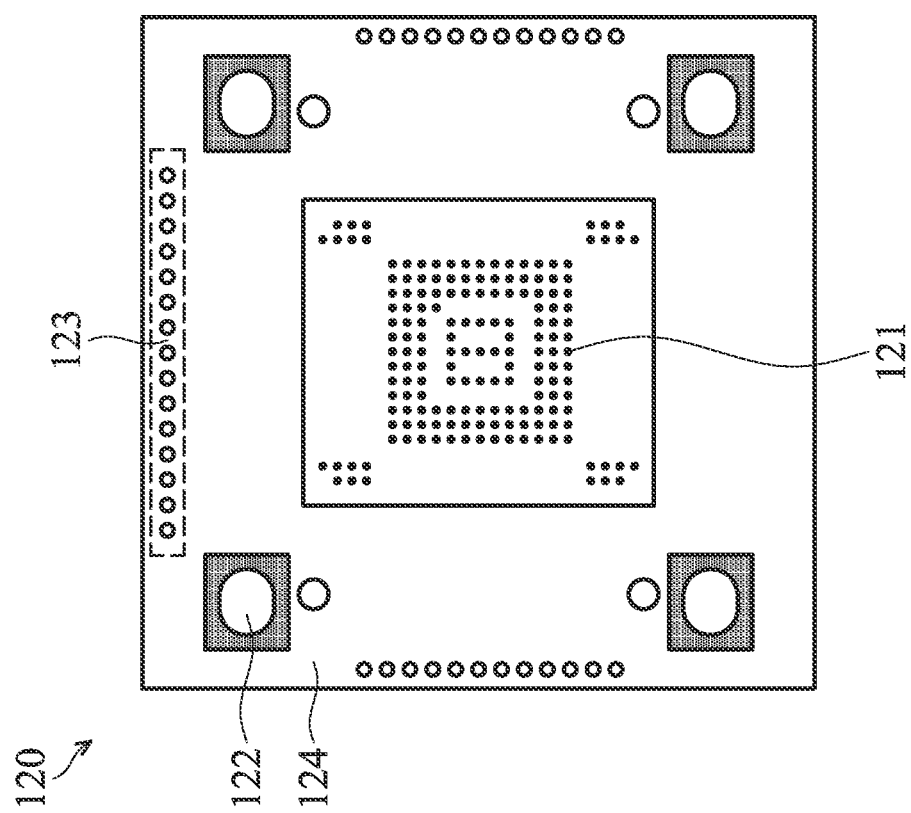
FIG. 3A is a schematic diagram of the separate PCB from the top view in accordance with an embodiment of the invention.

FIG. 3A is a schematic diagram of the separate PCB from the top view in accordance with an embodiment of the invention. FIG. 3B is a schematic diagram of the separate PCB from the side view in accordance with an embodiment of the invention. In an embodiment, the separate PCB 120 provides NAND flash pins and eMMC pins for signal testing. As shown in FIG. 3A, the separate PCB 120 comprises a plurality of pins (i.e. including eMMC and DDR memory pins) 121, a socket holder 122, eMMC pin header 123, and a plurality of NAND flash pins 124. In the invention, the separate PCB 120 and the interface PCB 110 of the testing apparatus 100 may separate the eMMC signals from the DDR memory signals, and the details will be described later. For example, the eMCP and CiMCP packages are packaging the eMMC and DDR memory onto the same chip. In the invention, the solder balls associated with the eMMC can be removed from the eMCP/CiMCP chip, and only the solder balls associated with the DDR memory remains. Then, the solder balls associated with the DDR memory are soldered to the interface PCB 110, and the interface PCB 110 is further soldered to the soldering place of the eMMC/eMCP/CiMCP chip on the testing PCB. Afterwards, the eMMC pins of the interface PCB 110 and the separate PCB 120 are soldered with jumpers and a header, so that the aforementioned components are assembled together to build connection of eMMC signals.

It should be noted that another eMMC chip should be placed into the socket device 130 during testing, wherein the eMMC chip has the same specifications as the eMMC circuit of the eMCP/CiMCP chip. Specifically, the eMMC chip can only operate regularly with a DDR memory under some testing environments (e.g. cellular phones). If the DDR memory or the eMMC chip of the eMCP/CiMCP chip is to be tested, the separate PCB 120 should be used, and the eMCP/CiMCP chip should be placed between the interface PCB 110 and the separate PCB 120. Meanwhile, another eMMC chip should be placed in the socket device 130, so that the eMMC signals can be separated from the DDR memory signals, and the eMCP/CiMCP chip can be tested accurately and quickly.

Figure 4A:
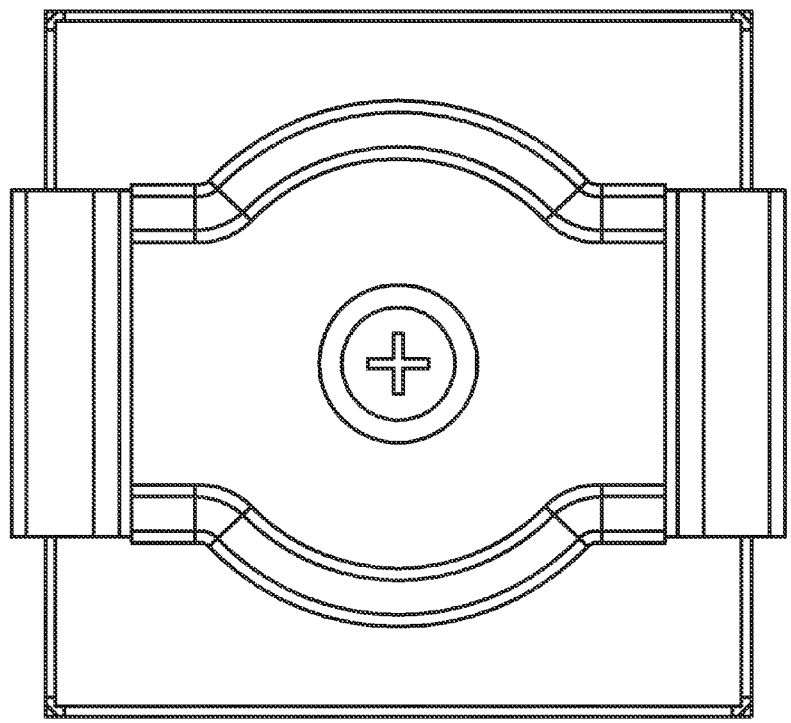
FIG. 4A is a schematic diagram of the socket device 130 from the top view in accordance with an embodiment of the invention.
Figure 4B:
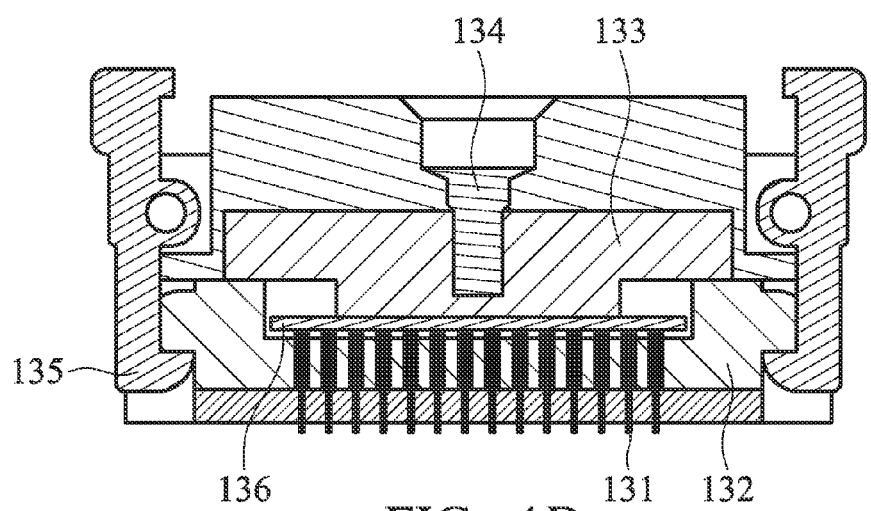
FIG. 4B is a schematic diagram of the socket device from the side view in accordance with an embodiment of the invention.

FIG. 4A is a schematic diagram of the socket device 130 from the top view in accordance with an embodiment of the invention. FIG. 4B is a schematic diagram of the socket device from the side view in accordance with an embodiment of the invention. As shown in FIG. 4B, the socket device 130 comprises a plurality of probes 131, a probe holder 132, a slider 133, a spring 134, and an upper cover 135, wherein the upper cover 135 includes the mounting bars 136. In an embodiment, the slider 133 should be taken out from the socket device 130 before placing the eMMC/eMCP/CiCMP chip in the position of the socket device 130. Since the thickness of each chip is different, an appropriate spring 134 should be chosen during the test, so that the slider 133 may compress the chip tightly, and the chip may connect to the probes 131.

In view of the above, a testing apparatus is provided. The testing apparatus can be used to separate eMMC signals from the eMCP/CiMCP chips, and the eMMC/CiMCP chip can be installed and replaced directly. In addition, the testing apparatus can be used to separate the eMMC signal from the DDR memory signals of the eMCP/CiMCP chips, and test the NAND flash signals on the eMMC chip.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A testing apparatus for testing a first flash memory chip, the testing apparatus comprising:
   an interface printed circuit board (PCB);
   a separate PCB, disposed over the interface PCB, wherein a second flash memory chip is placed between the interface PCB and the separate PCB, and the second flash memory chip comprises a first embedded flash memory chip and a dynamic random access memory (DRAM), wherein the second flash memory chip is connected to the interface PCB through corresponding first pins of the DRAM; and
   a socket device, disposed over the separate PCB and configured to install the first flash memory chip, wherein the first flash memory chip is connected to the interface PCB through corresponding second pins.

2. The testing apparatus as claimed in claim 1, wherein the testing apparatus utilizes both the first flash memory chip and the DRAM when testing the first flash memory chip.

3. The testing apparatus as claimed in claim 1, wherein the first flash memory chip and the first embedded flash memory chip support the embedded multimedia card (eMMC) specification.

4. The testing apparatus as claimed in claim 1, wherein the second flash memory chip supports the embedded multi-chip package (eMCP) standard and the card-interface multi-chip package (CiMCP) standard.

5. The testing apparatus as claimed in claim 1, wherein the interface PCB further comprise a lug boss, and the second flash memory chip is connected to the interface PCB via the first pins on the lug boss.

6. The testing apparatus as claimed in claim 1, wherein the interface PCB, the separate PCB and the socket device support the fine-pitch ball grid array (FBGA) 153 and FBGA162 standards.

7. The testing apparatus as claimed in claim 1, wherein the socket device further comprises: a probe holder, a slider, a spring, and an upper cover, wherein the first flash memory chip is placed between the slider and the upper cover, and the spring is used to hold the first flash memory chip.

* * * * *